(12) United States Patent
Woerner et al.

(10) Patent No.: US 6,748,656 B2
(45) Date of Patent: Jun. 15, 2004

(54) FOLDED-FIN HEATSINK MANUFACTURING METHOD AND APPARATUS

(75) Inventors: Klaus W. Woerner, Cambridge (CA); Ross D. Armstrong, Cambridge (CA)

(73) Assignee: ATS Automation Tooling Systems Inc., Cambridge (CA)

( * ) Notice: Subject to any disclaimer, the term of this patent is extended or adjusted under 35 U.S.C. 154(b) by 218 days.

(21) Appl. No.: 09/908,674

(22) Filed: Jul. 20, 2001

(65) Prior Publication Data

US 2002/0007936 A1 Jan. 24, 2002

Related U.S. Application Data

(60) Provisional application No. 60/219,648, filed on Jul. 21, 2000.

(51) Int. Cl.⁷ ................................................ B23P 15/26
(52) U.S. Cl. ................................. 29/890.03; 29/890.054
(58) Field of Search .......................... 29/890.03, 428, 29/890.054; 219/121.63, 78.12, 121.64; 165/80.3

(56) References Cited

U.S. PATENT DOCUMENTS

| 5,229,918 A | * | 7/1993 | Della Bosca et al. ........ 361/710 |
| 5,771,966 A | * | 6/1998 | Jacoby ......................... 165/185 |
| 6,241,006 B1 | * | 6/2001 | Shih ........................... 165/80.3 |
| 2002/0179285 A1 | * | 12/2002 | Sas et al. .................... 165/80.3 |
| 2002/0179290 A1 | * | 12/2002 | Larson .................... 165/104.33 |
| 2003/0030980 A1 | * | 2/2003 | Bird et al. ................... 361/694 |
| 2003/0063439 A1 | * | 4/2003 | Wei et al. .................... 361/703 |

* cited by examiner

*Primary Examiner*—I Cuda Rosenbaum
(74) *Attorney, Agent, or Firm*—R. Craig Armstrong; Borden Ladner Gervais LLP

(57) ABSTRACT

The method and apparatus for manufacturing of folded-fin heat sink assemblies provide laser welding of the folded-fin assembly to the base, core or other heat-absorbing mass, at selected locations, prior to brazing or otherwise bonding. This ensures proper positioning of the folded-fin assembly relative to the heat-absorbing mass, and proper spacing between adjacent fins.

16 Claims, 17 Drawing Sheets

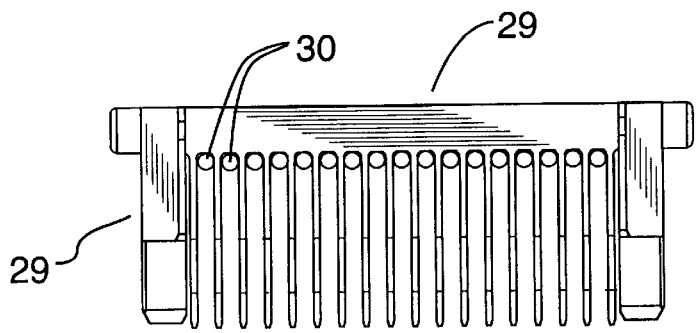
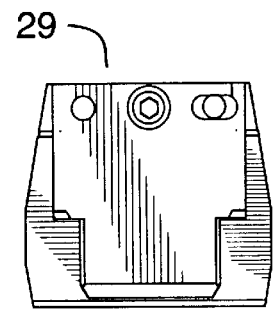
FIG.5A                FIG.5B
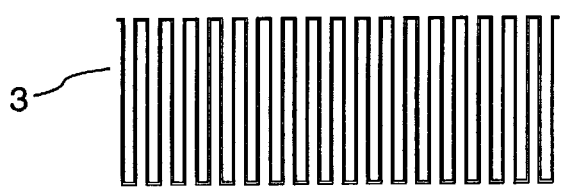
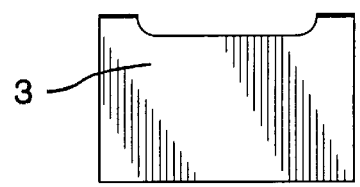
FIG.5C                FIG.5D
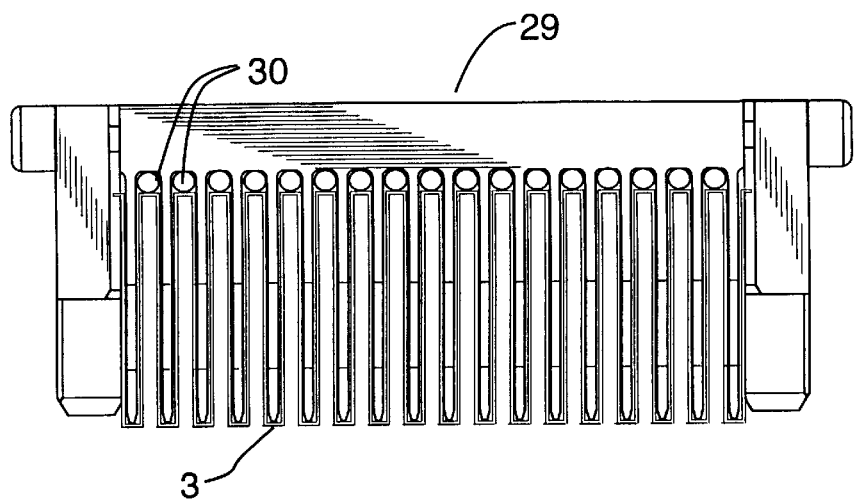
FIG.5E

FOLDED-FIN HEATSINK MANUFACTURING METHOD AND APPARATUS

REFERENCE TO RELATED APPLICATION

This is a formal application based on and claiming the benefit of U.S. provisional patent application No. 60/219,648, filed Jul. 21, 2000.

BACKGROUND OF THE INVENTION

The present invention relates to a method of manufacturing a folded-fin heat sink assembly, using laser welding to tack a folded-fin assembly to a base, core or other heat-absorbing mass prior to brazing, and to apparatus for carrying out the method.

Folded-fin heat sinks are intended for use as active or passive heat sinks for microprocessor packages. Over the years, power used by microprocessors has increased considerably, and consequently, so has the heat generated by these devices. In order to provide adequate cooling, heat sinks with greater cooling capacities have become essential. If adequate cooling is not provided, the devices may overheat, resulting in damage to the devices and/or a reduction in operating performance. As a general rule, the performance of integrated circuit devices improves when they are operating at lower temperatures. Hence more effective heat sinks are needed, to facilitate lower integrated circuit operating temperatures.

In addition to meeting cooling requirements, heat sinks must accommodate space limitations. They must therefore be as compact and efficient as possible. They must also be as light in weight as possible, and must be capable of being efficiently mass-produced.

Historically within the microprocessor industry, the majority of heat sink solutions have used aluminum extrusions, typically using aluminum alloys 6061 T6 (with a thermal conductivity of 167 W/mK), or 6063 T6 (with a thermal conductivity of 200 W/mK), for example. The surface area aspect ratio (i.e. the ratio of surface area to base area) is typically limited to a maximum of about 12:1 with such extrusions. However, the higher power microprocessors now on or coming into the market require more efficient and effective cooling than can be achieved with the old extrusions.

To provide this greater efficiency and effectiveness in cooling microprocessors, "folded-fin" heat sinks have become known recently. In most such heat sinks, a length of thin metal (normally aluminum or an aluminum alloy) is successively folded to produce fins extending upwardly from a high-thermal-conductivity base (normally copper or an aluminum alloy), the fins being integrally joined alternately by upper and lower web portions, the lower web portions being bonded to the base. The base in turn is mounted on top of the microprocessor package, to collect the heat therefrom. For an active heat sink, a fan is suitably mounted to draw or force air through channels between adjacent fins.

In some such heat sinks, referred to as radial designs, the folded-fin assembly is arranged around a cylindrical core, such that the fins extend radially outwardly from the core. In such designs, the "lower" (inner) webs are secured to the core rather than to a base. There is normally a separate base to which the core is bonded, or the core may be integrally formed with the base, or the bottom of the core may itself constitute the base which contacts the microprocessor or other heat-generating device.

A key difficulty in the prior art is being able to manufacture these folded-fin heat sink assemblies efficiently and with reliable quality control. In particular, in brazing, soldering or otherwise bonding the folded-fin assembly to the base, it is difficult to maintain proper alignment of the assembly and proper spacing of adjacent fins. In the usual design, the folded-fin assembly tends to float on the base, and there is an accordion-like tendency for the spacing between adjacent fins to float as well, with wicking tending to pull fins together. In a radial design, similar problems exist with positioning the folded-fin assembly on the core. These factors can affect performance, i.e. heat dissipation efficiency, as well as aesthetics of the product.

To some extent, this problem can be overcome by the use of suitable fixtures to hold the folded-fin assembly in place. However, this requires a greater capital outlay (i.e. for a significant volume of suitable fixtures), and also results in higher operating costs, principally the energy cost in the brazing furnace for heating not just the folded-fin and base, but also the fixtures.

For convenience, all references herein will be to brazing of the folded-fin assembly to the base, but it should be appreciated that the invention is applicable to any other form of bonding of the folded-fin assembly to the base. Also for convenience, most references will be to the "usual" design of the folded-fin assembly having its fins extending upwardly from a base, but it should be appreciated that the same principles will apply to radial designs.

SUMMARY OF THE INVENTION

It is an object of the invention to provide a method for improved manufacturing of folded-fin heat sink assemblies, and to provide suitable apparatus for carrying out that method.

Therefore the invention provides laser welding of the folded-fin assembly to the base (or core) at selected points, prior to brazing or otherwise bonding to the base (or core), to properly position the folded-fin assembly and to maintain proper spacing between adjacent fins. The welds are robust enough to prevent fins from floating on the liquidus interface created in the brazing process. After the laser welding, the assembly is brazed, to provide full contact between the web portions of the folded-fin assembly and the base or core.

In the preferred method and apparatus, finger elements are inserted between adjacent fins, to maintain proper spacing, and the folded-fin assembly is pressed against the base or core to ensure good contact, before laser welding.

In the preferred embodiment of the apparatus, there is a first station for loading components of the heat sink assembly into suitable fixturing, and a welding station where the laser welding is effected. Preferably, the stations are at different circumferential locations around a rotatable dial assembly. If desired, there can be a separate unload station between the welding station and the first station, and/or a second station between the first station and the welding station, where a finger tool is inserted in each folded-fin assembly, and each folded-fin assembly is then lifted the finger tool into position on the base.

Further features of the invention will be described or will become apparent in the course of the following detailed description.

BRIEF DESCRIPTION OF THE DRAWINGS

The invention will now be described in detail, with reference to the accompanying drawings of the preferred embodiment by way of example only. In the drawings:

FIG. 5A is a side view of the finger tool;

FIG. 5B is an end view of the finger tool;

FIG. 5C is a side view of a folded-in assembly;

FIG. 5D is an end view of a folded-fin assembly;

FIG. 5E is a side view of the finger tool installed in the folded-fin assembly;

DETAILED DESCRIPTION
Description of Heat Sink Assembly

FIGS. 1A to 3F illustrate typical folded-fin heat sink assemblies 1, including a base or base plate 2, and one or more folded-fin assemblies 3 tacked to the base at selected points by the laser welds 4 of the invention. In a subsequent operation, the full surface of the lower web portions of the folded-fin assemblies are bonded to the base, typically by brazing.

Figure 1A:
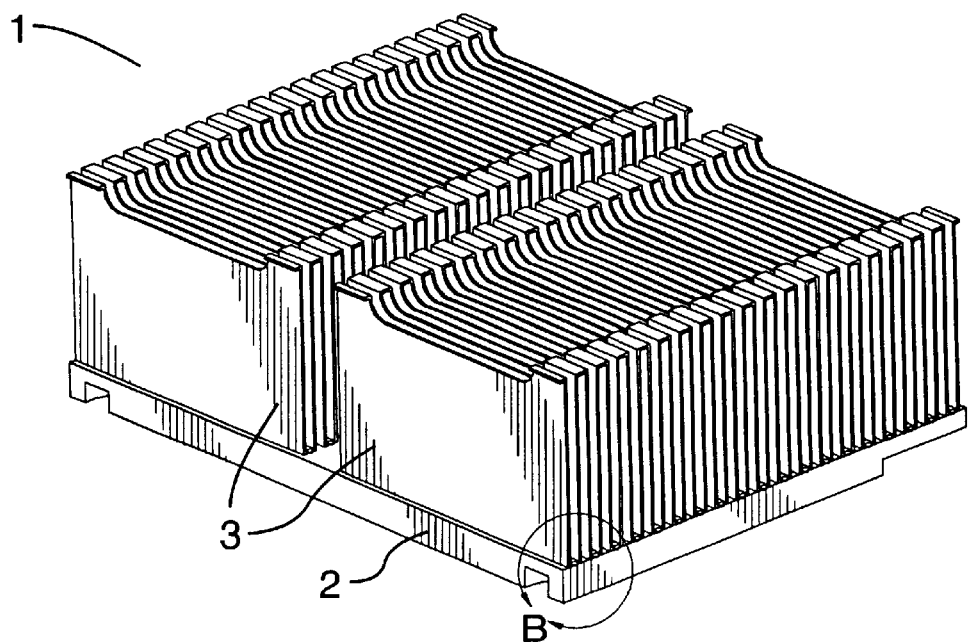
FIG. 1A is a perspective view of a first exemplary embodiment of a heat sink assembly according to the invention, having two separate folded-fin assemblies mounted on a base.
Figure 1B:
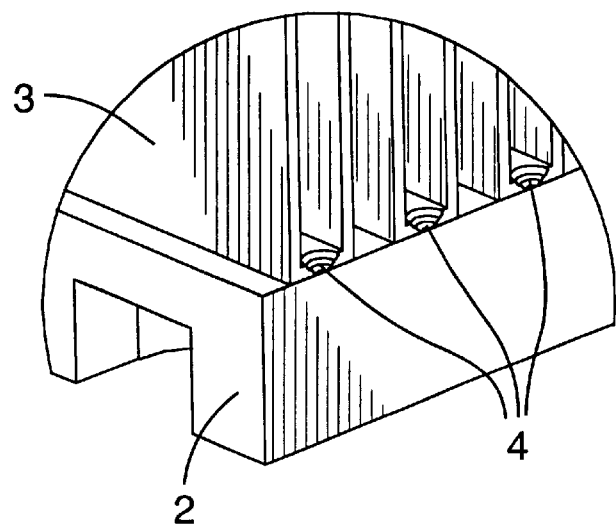
FIG. 1B is a blow-up of a portion of FIG. 1A, to show the laser welds more clearly.
Figure 1C:
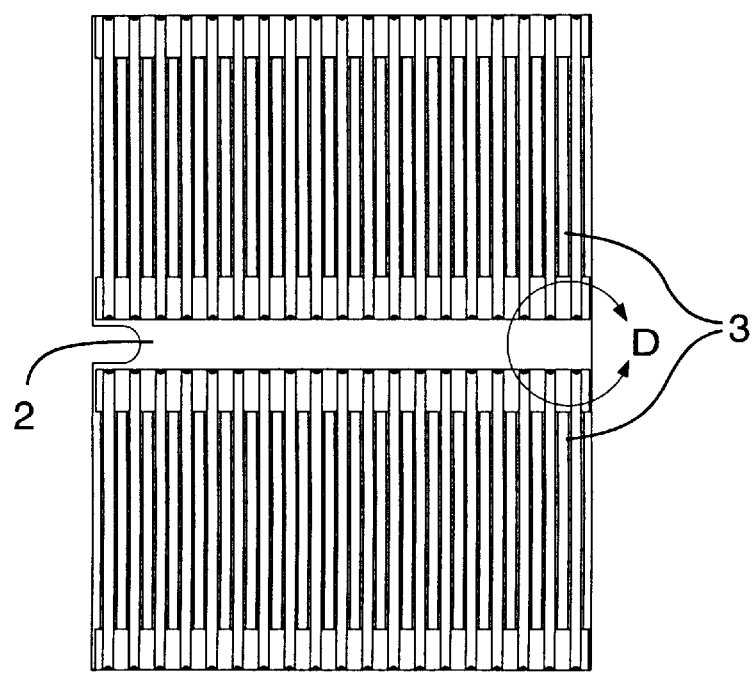
FIG. 1C is a top view of the first embodiment.
Figure 1D:
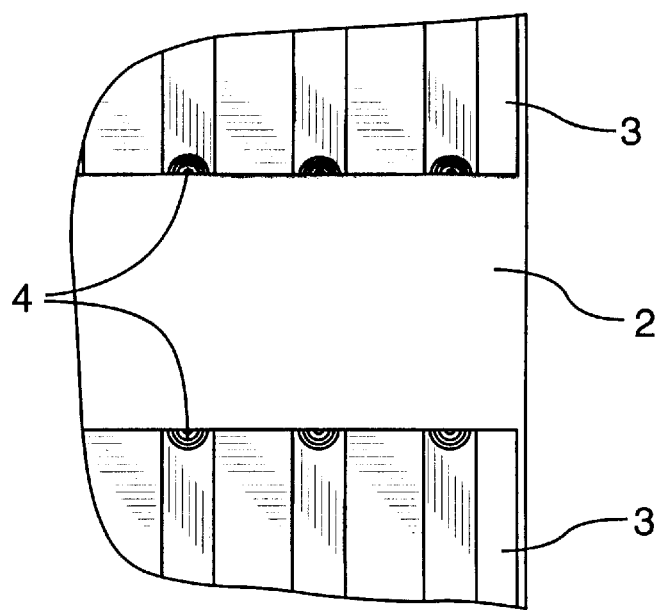
FIG. 1D is a blow-up of a portion of FIG. 1C.
Figure 2A:
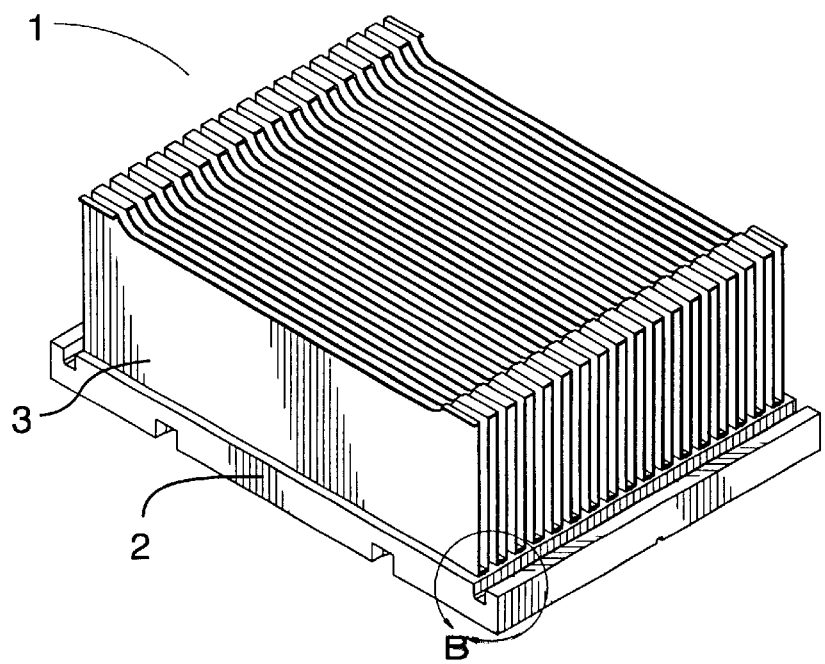
FIG. 2A is a perspective view of a second exemplary embodiment of a heat sink assembly according to the invention, having a single folded-fin assembly mounted on a base.
Figure 2B:
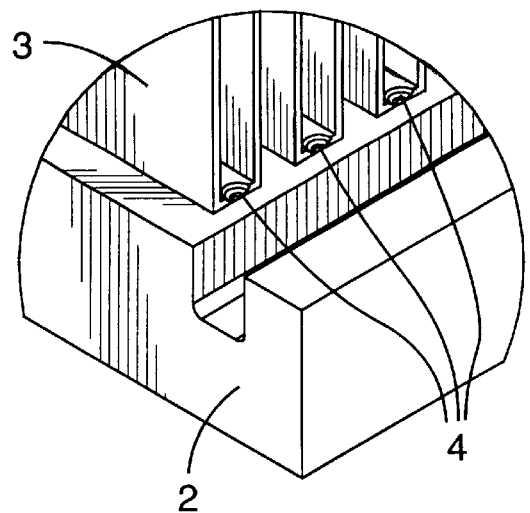
FIG. 2B is a blow-up of a portion of FIG. 2A.
Figure 2C:
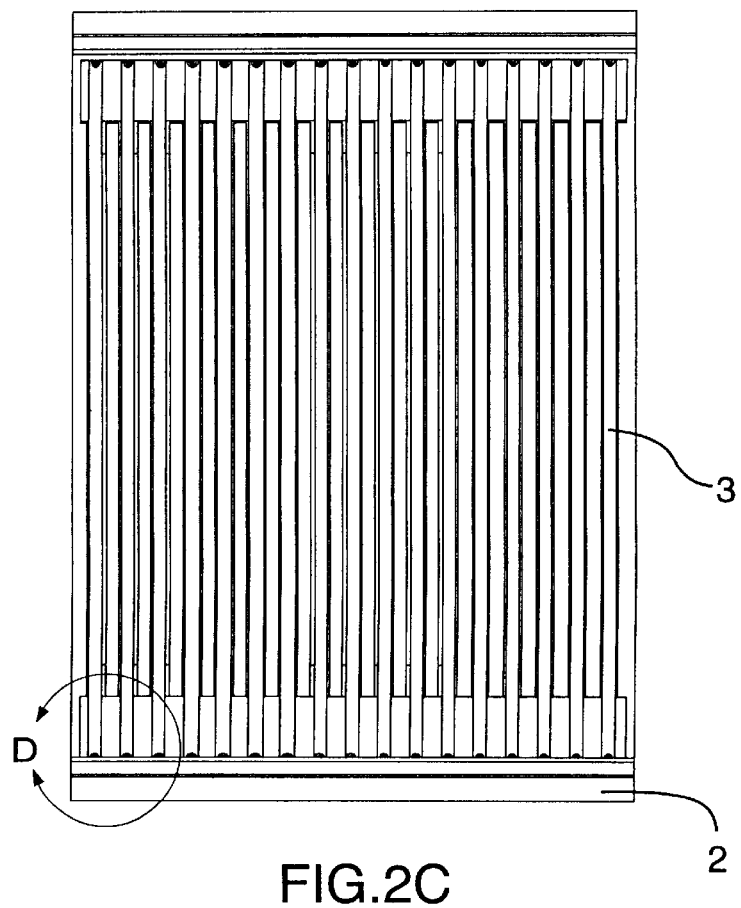
FIG. 2C is a top view of the second embodiment.
Figure 2D:
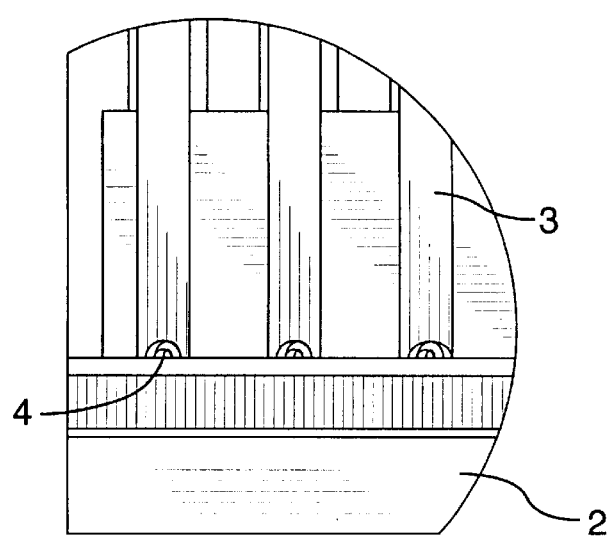
FIG. 2D is a blow-up of a portion of FIG. 2C.
Figure 2E:
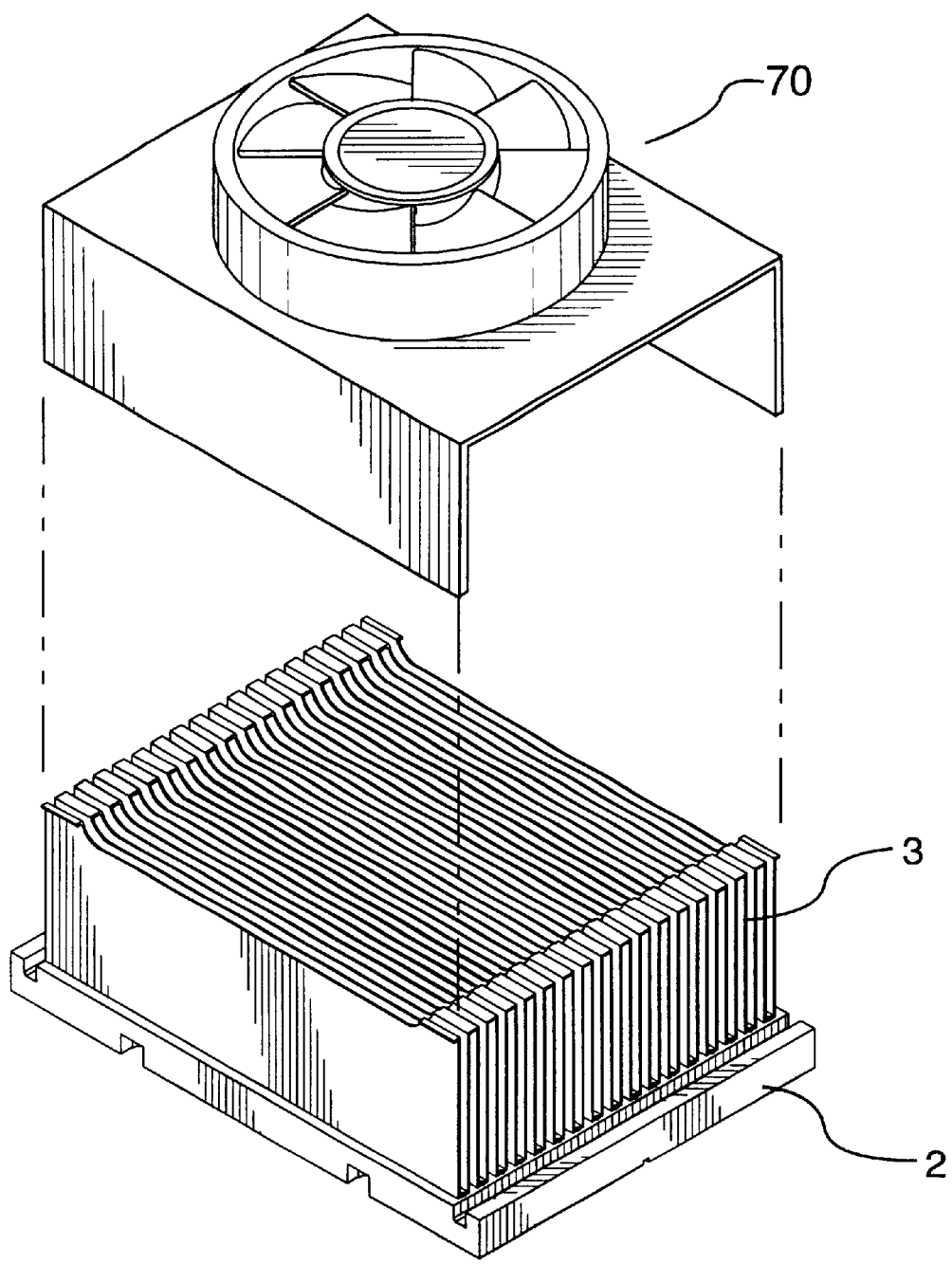
FIG. 2E is an exploded perspective of the second embodiment, showing a typical fan.

In use, the heat sink assembly is mounted on the upper surface of a heat source such as a microprocessor, and would normally include a fan 70, mounted for example across the top of the folded-fin assembly as shown in FIG. 2E. A passive folded-fin heat sink assembly would be substantially similar, except for the fan.

FIGS. 1A to 1D illustrate a dual rectangular folded-fin assembly. Laser welds 4 are positioned preferably but not necessarily at each lateral edge of each lower web portion 11, where it contacts the base 2, i.e. in this embodiment there are four rows of separate welds, namely one row along each lateral edge of the two folded-fin assemblies.

FIGS. 2A to 2D illustrate a similar heat sink, but having only one larger folded-fin assembly. Again, laser welds 4 are positioned preferably but not necessarily at each lateral edge of each lower web portion 11.

Figure 3A:
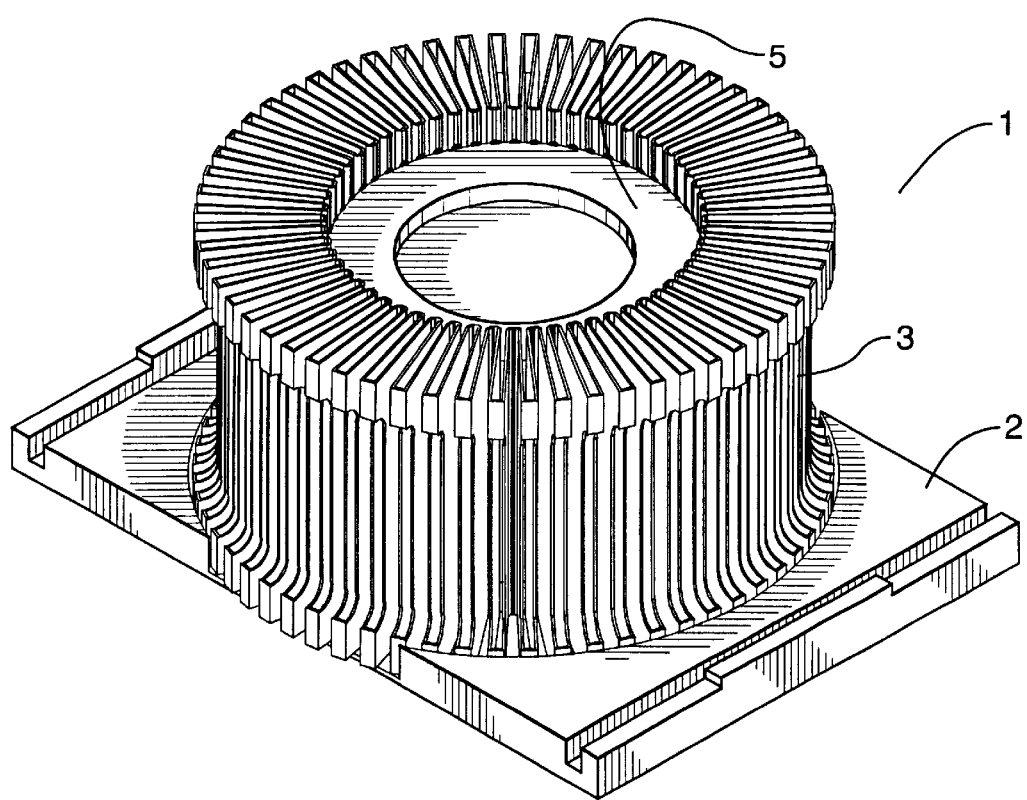
FIG. 3A is a perspective view of a somewhat different third embodiment of a heat sink assembly according to the invention, wherein the folded-fin assembly is mounted around a central core rather than on the base.
Figure 3B:
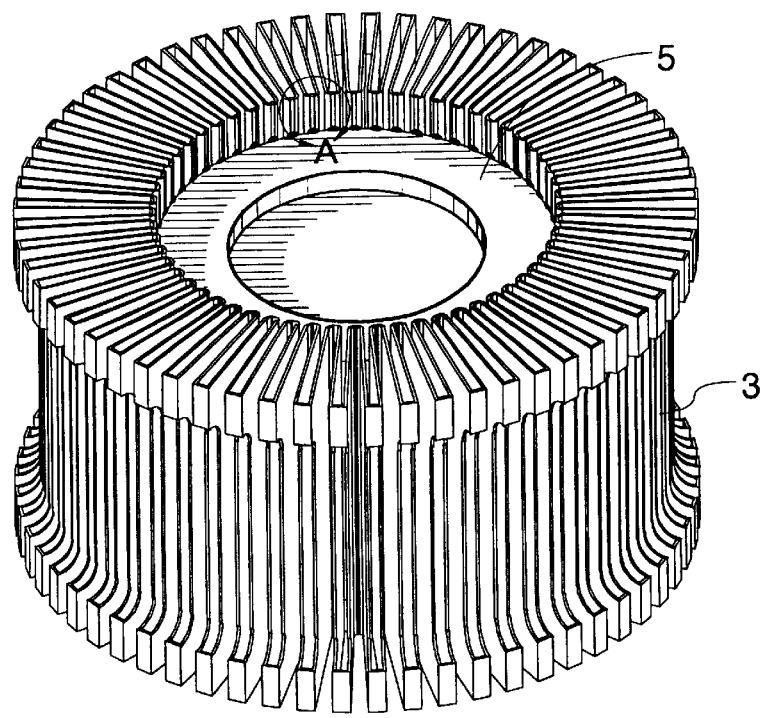
FIG. 3B is a perspective view of the third embodiment, showing just the folded-fin assembly and the core.
Figure 3C:
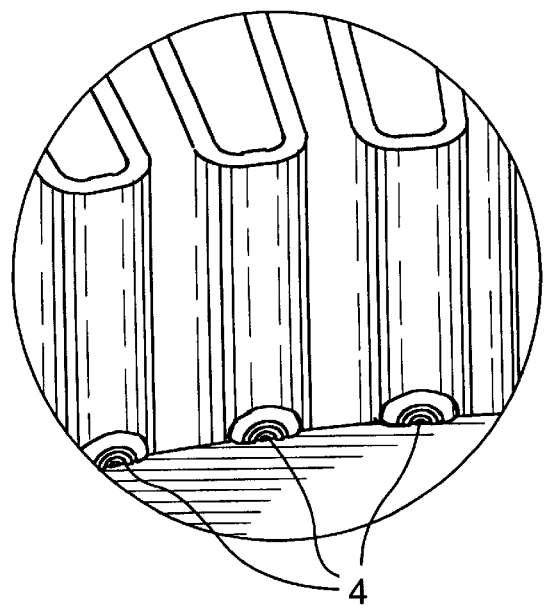
FIG. 3C is a blow-up of a portion of FIG. 3B.
Figure 3D:
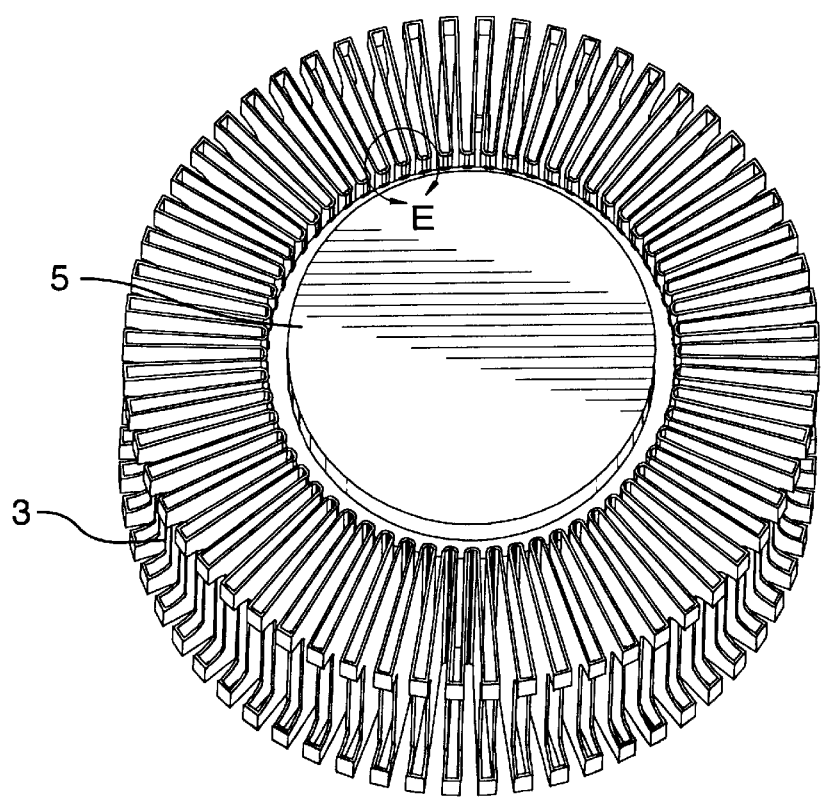
FIG. 3D is a bottom perspective view of the third embodiment.
Figure 3E:
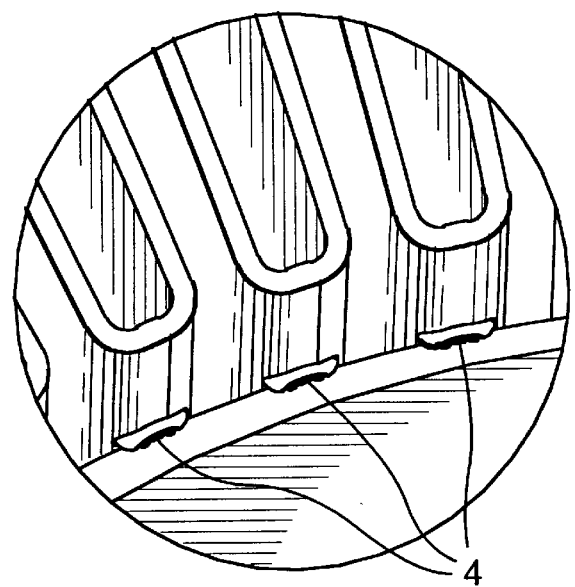
FIG. 3E is a blow-up of a portion of FIG. 3D.
Figure 3F:
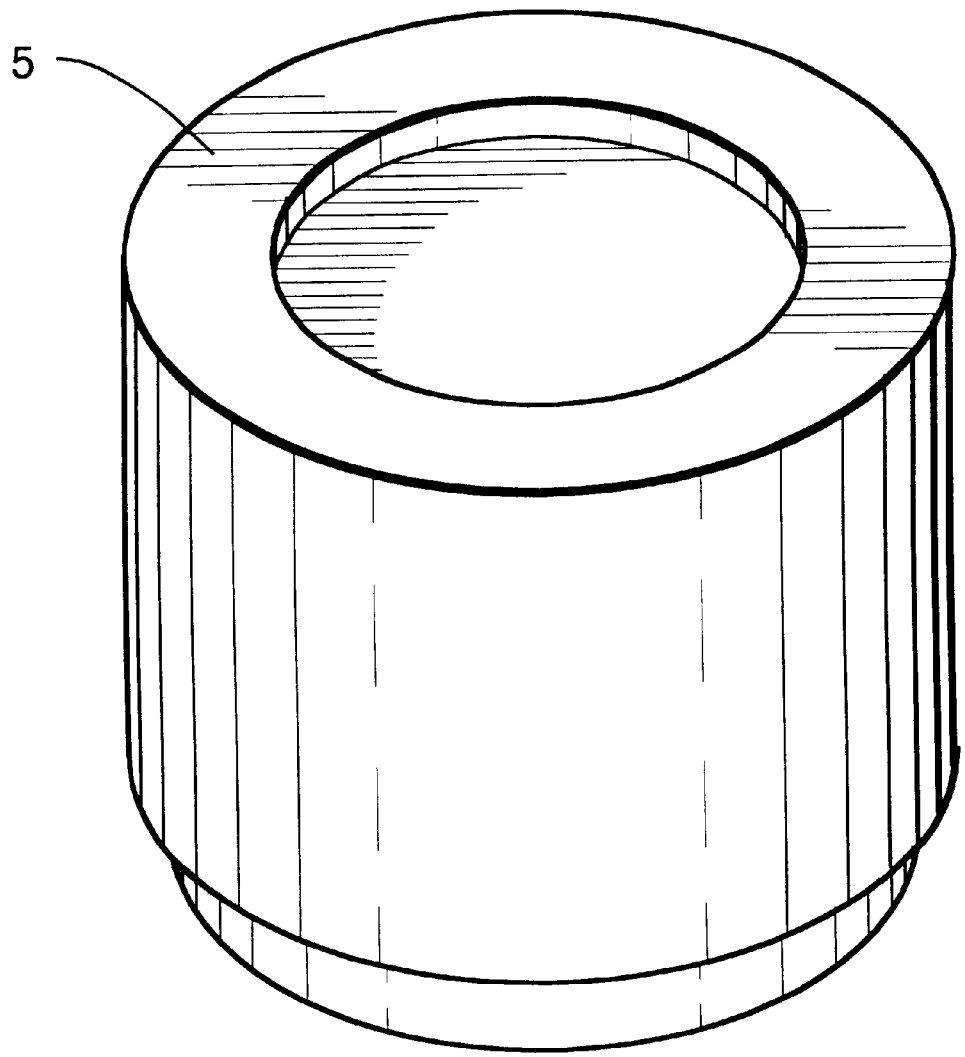
FIG. 3F is a perspective view of the core used in the third embodiment.
Figure 4:
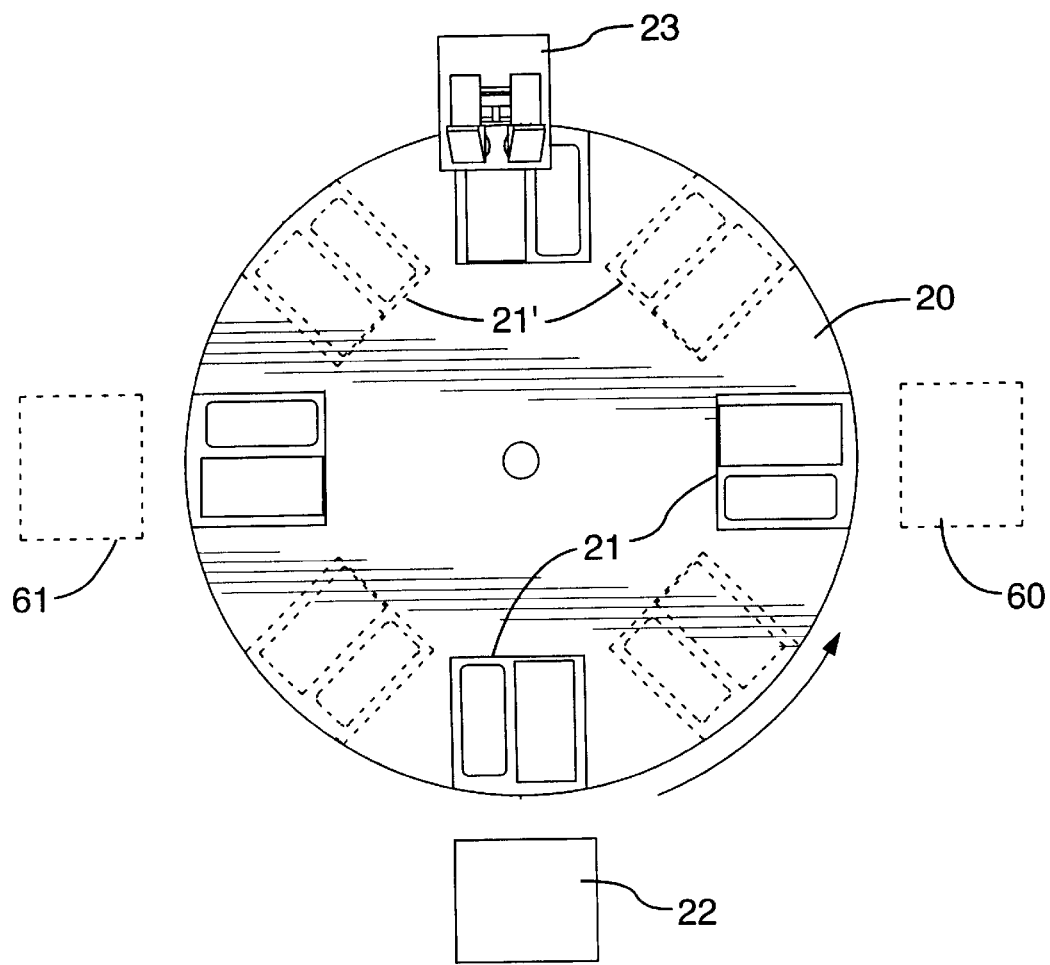
FIG. 4 is a schematic top view of the preferred embodiment of the apparatus.

FIGS. 3A to 3F illustrate a radial configuration, where the folded fins are wrapped around a central core 6. The core itself is illustrated in FIG. 3F. In this case, the laser welds 4 are positioned around the periphery of the core, at both upper and lower ends, where the inner web portions 11' contact the core. The core is eventually bonded to the base 2, as seen in FIG. 3A. For clarity, the following description will refer to the fins being welded to the base, as in FIGS. 1 and 2. However, it should be clearly appreciated that the principle is the same in FIG. 3, where the welds are to the core. The essence is that laser welding is being used to secure the folded-fin assembly to a heat transfer mass prior to final attachment by brazing (for example), whether that mass is the base or a core attached to (or integral to) the base.

The folded-fin assembly 3 is bonded to the base 2, typically by brazing. The base commonly is manufactured by fine-blanking in order to provide high flatness, from a high purity, high thermal conductivity material such as 1100 aluminum (with a thermal conductivity of 222 W/mK), but could be produced by extrusion, machining or any other suitable process.

The folded-fin assembly 3 is normally produced by feeding a roll-bonded dual alloy aluminum strip through a set of blades which are actuated through a cam action to produce its accordion-like structure, with adjacent fins 9 separated by integral alternating upper and lower web portions 10 and 11 respectively. The method of manufacturing the folded-fin assembly is not part of the invention. In a typical embodiment, one side of the strip is aluminum alloy 3003-0 (with a thermal conductivity of 193 W/mK), and the other side—the one intended to contact the base—is a one-sided 10% clad alloy of Aluminum Alloy 4045-0 (with a thermal conductivity of 172 W/mK. It should be clearly understood that this is one example only, and that the invention is in no way limited to any particular choice of materials, which could include, as further non-limiting examples, aluminum fins on an aluminum base, aluminum fins on a copper base, or copper fins on a copper base. The invention relates to the method and to apparatus for carrying out the method, and is not restricted to any particular materials for the fins or the base.

Airflow cutouts 12 are provided in the upper web portions and adjacent portions of the fins, by pre-stamping the strip aluminum in a process-synchronous manner prior to the fin-folding cam action taking place. This opening geometry maximizes the effect and efficiency of the airflow produced by the fan, by providing an airflow path.

Description of the Preferred Method

In the method provided by the invention, the folded-fin assembly is laser welding to the base, prior to brazing or otherwise bonding to the base. The laser welds 4 are positioned at various locations at edges of the lower web portions 11. Obviously, they could be provided at every outer edge of every lower web portion, or they could be provided at suitably spaced-apart locations, for example every second or third adjacent lower web portion. The trade-off is between the desirability of greater positioning control, and the undesirability of longer processing times.

Preferably, some suitable mechanical means is used to urge the lower web portions 11 against the base 2 prior to the laser welding, to optimize the contact between the lower web portions and the base when the subsequent brazing takes place. An example of such mechanical means will be seen in the preferred apparatus described below, but any such means could be employed.

Also preferably, a finger tool 29 is used to maintain the desired spacing between adjacent fins prior to the laser welding, to optimize that spacing and avoid the possibility of adjacent fins being positioned unevenly or even in contact with each other. An example of such a tool will also be seen in the preferred apparatus described below.

As mentioned above, the laser welding ensures proper positioning of the folded-fin assembly and maintains proper spacing between adjacent fins. After the laser welding, the folded-fin and base assembly is brazed, to provide full contact between the bottom web portions of the folded-fin assembly and the base. The welds are robust enough to prevent fins from floating on the liquidus interface created in the brazing process.

Suitable laser welding apparatus, power levels, cycle times, etc., will be readily selected by those with knowledge in the field of laser welding, to readily provide proper welds with suitable weld characteristics similar to those desired in other welding situations.

To summarize, the method of the invention includes the steps of positioning a folded-fin assembly 3 on a base 2 or around a core 5, and then laser welding selected portions (edges, for example) of selected web portions (every one, for example) to the base or core to generally maintain that positioning, prior to fully bonding the web portions to the base or core, for example by brazing.

The preferred apparatus for carrying out the method will now be described.

Description of the Preferred Apparatus

In the preferred embodiment of the apparatus, described with reference to the heat sink configuration of FIGS. 1A to 1D, a turntable or rotary dial 20 carries part support fixtures 21 past at least two stations. The first station 22 is a load/unload station, and the second station is a welding station 23 where the laser welding is carried out, in preparation for subsequent brazing. While laser welding is being carried out at the welding station, finished parts are unloaded and unfinished parts are loaded into the part support fixtures at the first station. Rotation of the dial takes the finished parts from the welding station to the first station for unloading, and carries unfinished parts to the welding station for laser welding.

Although not present in a prototype embodiment of the invention, it is possible that other stations could be provided. For example, between the first station and the welding station, there could be a second station 60 where a pick and place robot (not shown) lifts the finger tool 29 (described below), places it into the folded-fin assembly, and then places the folded-fin assembly onto the base, instead of these steps being carried out manually or automatically at the first station.

Similarly, between the welding station and the first station, there could be an unload station 61, where the finger tool 29 was removed from the part and returned to its nest 28 in the part support fixture 21, and where the part is removed from the apparatus, instead of this being done at the first station.

It is also possible that there could be more than one welding station, so that multiple laser welding operations can be conducted simultaneously.

Obviously, it is also conceivable that some automated sequential movement other than rotation with a dial assembly could be used. There could be a linear conveyor, with the parts mounted on pallets, with pallets and finger tools being routed or carried manually from an unload area back to the load area. The dial assembly has certain obvious practical advantages, but in some cases a linear operation may be more advantageous for other reasons.

Depending on the size of the dial 20, multiple fixturing locations can be provided. For example, the outer surface of the dial could carry additional part support fixtures 21', such that the dial might only have to rotate perhaps 45 degrees or less between each operation.

Figure 6:
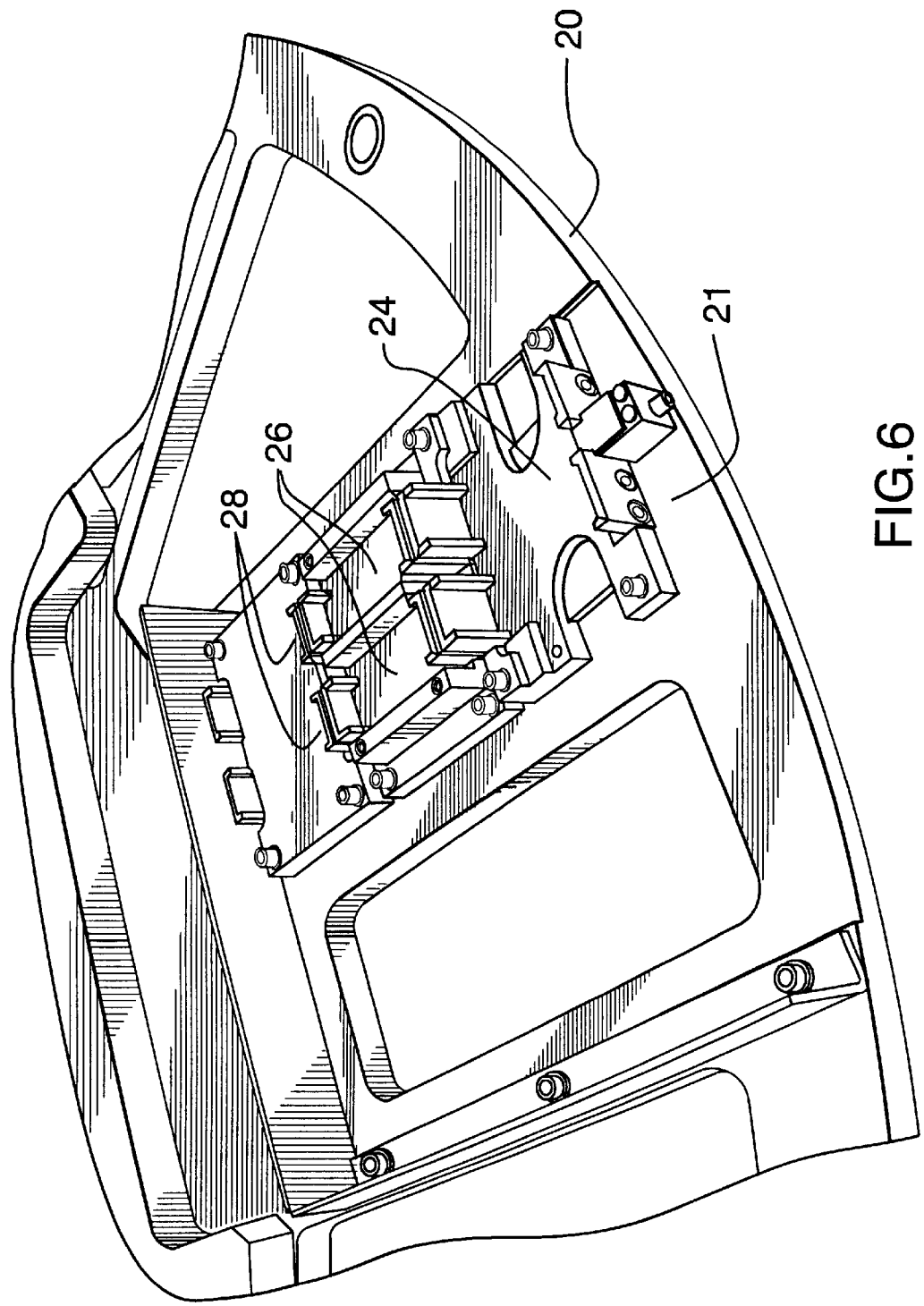
FIG. 6 is a perspective view of the turntable or dial, with the parts nests empty.
Figure 7:
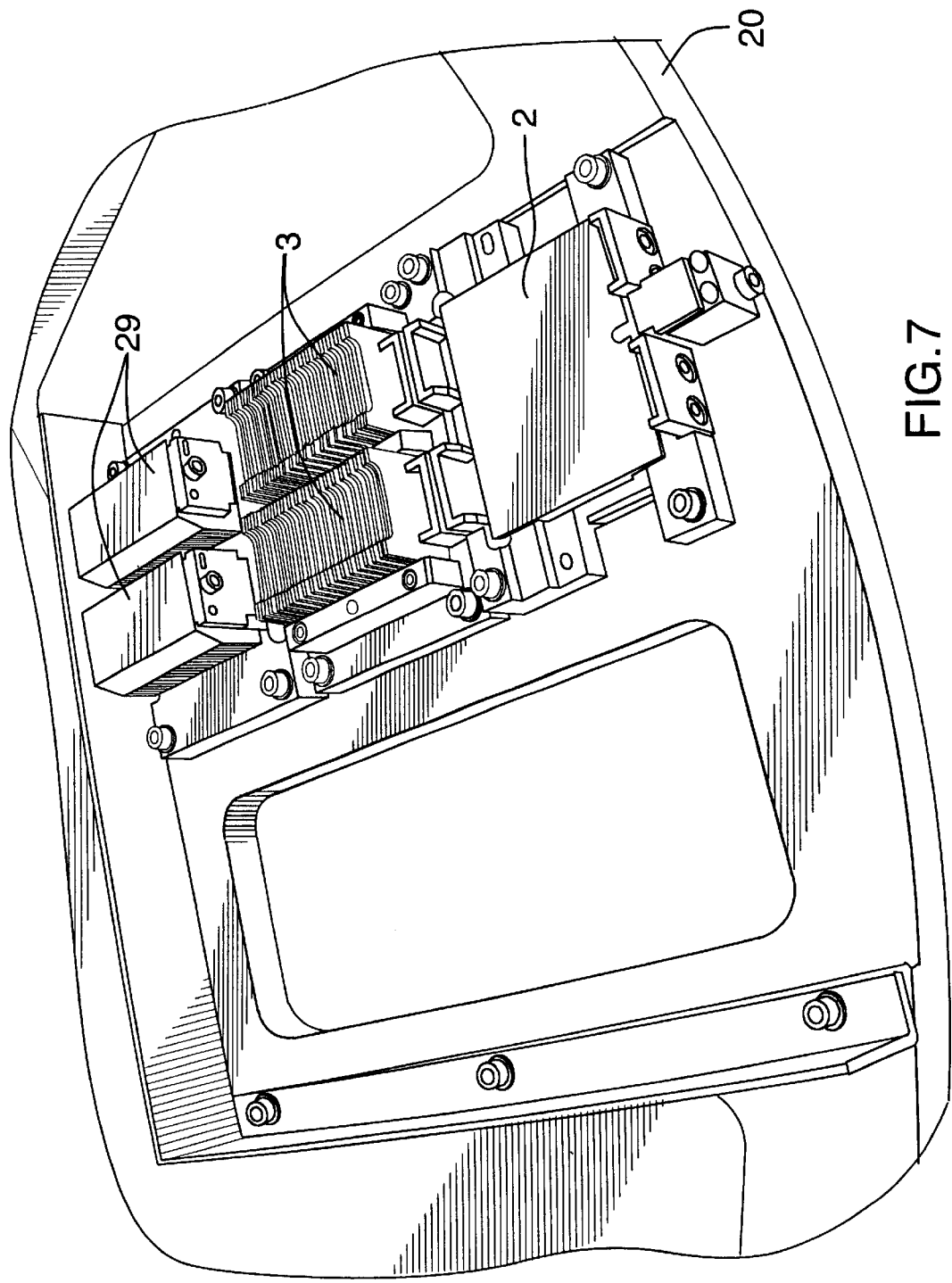
FIG. 7 is a corresponding perspective view, with the finger tools, folded-fin assemblies and base in their respective nests.
Figure 8:
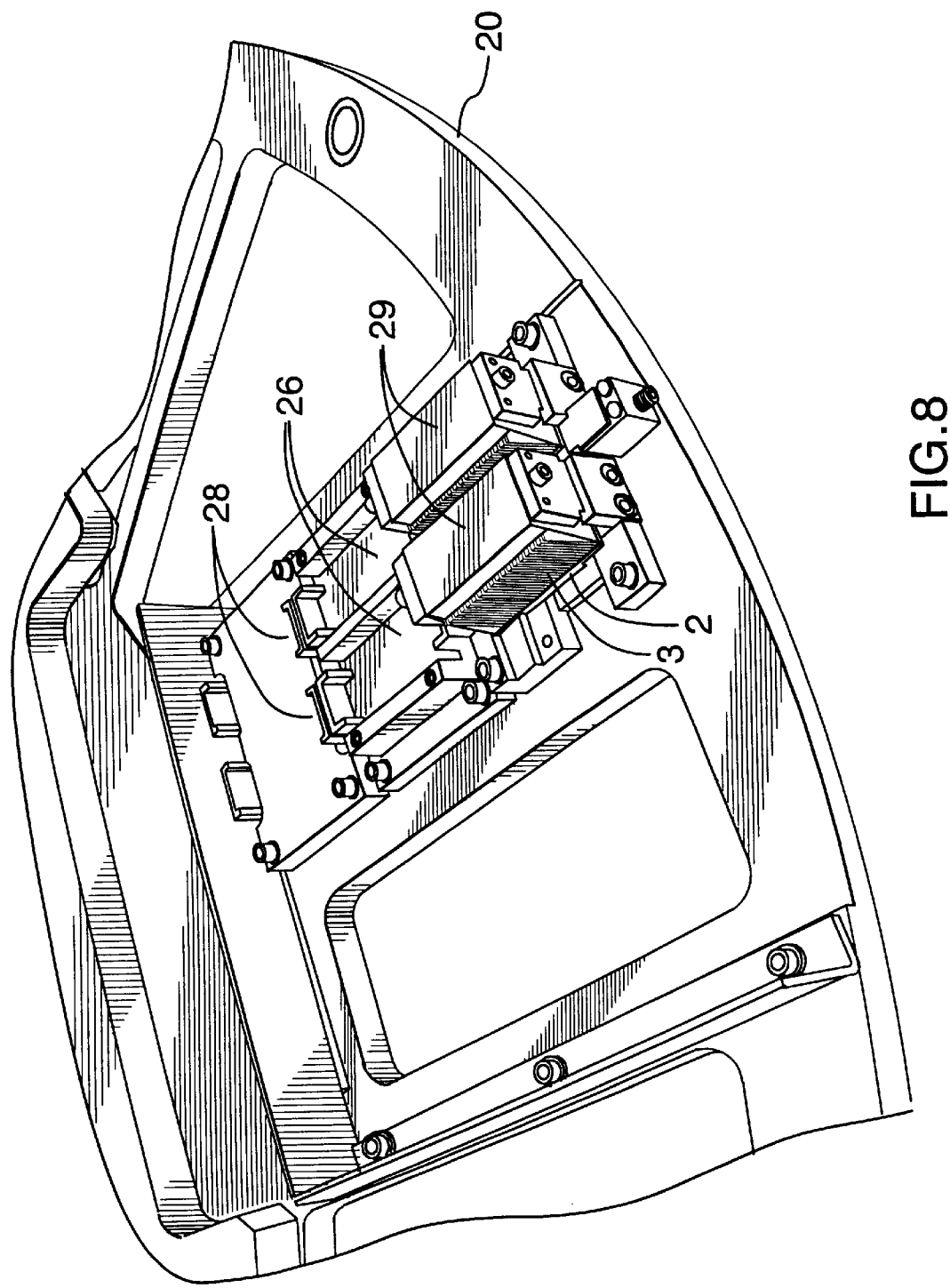
FIG. 8 is a corresponding perspective view, with the folded-fin assemblies lifted onto the base by the finger tools.

At each fixture location, there could be areas for supporting more than one heat sink assembly and tooling. For example, in the embodiment as illustrated in FIGS. 6–8, there are two such areas at each location (the area shown carrying fixtures and the open area to its left), so that each fixture location could carry two separate heat sinks and associated tooling. The dial could then be indexed just slightly, i.e. a small indexing, before a larger indexing to the next fixturing station, or the laser (having x-y movement as described below) could be translated as required.

In the preferred embodiment, as seen best in FIGS. 6 to 8, the fixture area 21 for each heat sink includes a nest 24 to receive a heat sink base 2, an adjacent nest or nests 26 to receive one or more folded-fin assemblies 3, depending on how many such folded-fin assemblies are to be mounted on the base, and one or more corresponding nests 28 for a finger tool 29 for each folded-fin assembly.

At the loading station, once the base 2, folded-fin assemblies 3 and finger tools 29 are in place, a pick-and-place robot (not shown) grabs each finger tool, lifts it above its folded-fin assembly, and lowers it into the folded-fin assembly to serve the dual purpose of being able to lift the folded-fin assembly and ensure proper alignment and spacing of the folded fins. This is most clearly seen in FIG. 5E, which is a side view showing the finger tool 29 inserted into a folded-fin assembly 3. Once the folded-fin assembly has been captured by the finger tool, the pick and place robot then lifts it and places it onto the base 2. The fixturing around the base then also maintains the position of the folded-fin assembly and finger tool. This entire sequence can be carried out manually if desired, i.e. an operator can insert the finger tool in the folded-fin assembly and place them on the base.

The folded-fin assemblies and base may be loaded into the fixtures manually, or this function could be automated. For example, a pick-and-place robot, probably but not necessarily the same one which installs the finger tool in the folded-fin assembly and lifts them onto the base, could remove folded-fin assemblies and bases from pallets passing by the system on a conveyor, and could then deposit them into the fixtures. Conceivably, the robot could take a base from the conveyor, deposit in its nest 24, then pick up a finger tool 29 from its nest 28, insert it in a folded-fin assembly on the conveyor, and then carry them directly to the base, i.e. with no need for a nest 26 for the folded-fin assemblies.

In any event, once the folded-fin assemblies 3 and finger tools are properly positioned on the base 2, the dial 20 can be rotated to carry these parts to the welding station 23.

Figure 13A:
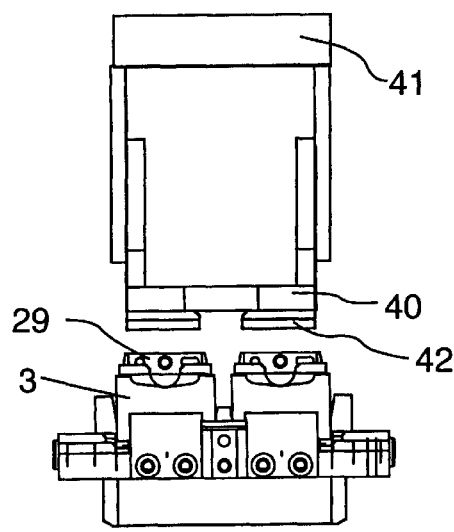
FIG. 13A is a radial view corresponding to FIG. 11, with the resilient plates raised.
Figure 13B:
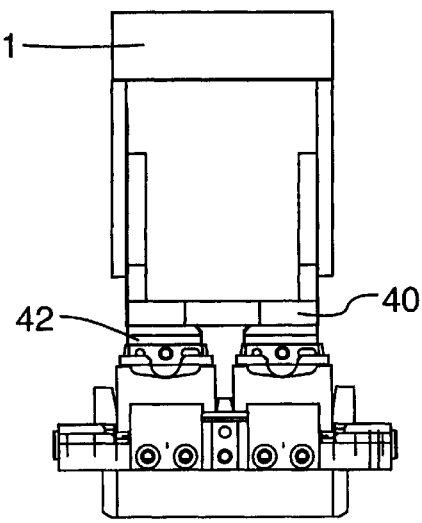
FIG. 13B is identical to FIG. 13A, except showing the resilient plates urged against the finger tools.

As illustrated in FIGS. 11–13B, when the parts arrive at the welding station, two plates 40 mounted on a stationary frame 41 are pneumatically driven down onto the upper surface of respective finger tools 29. FIG. 13A shows the plates retracted, and FIG. 13B shows them urged downwardly against the finger tools. The plates preferably have a resilient lower surface 42, for example a piece of rubber. This, combined with preferable rubber inserts 30 across the upper channels of the finger tools, act to ensure that the fins properly contact the base before the laser welding takes place. Although this feature is not strictly essential, it ensures that the laser welding anchors the folded-fin assemblies in a position where they are in optimum contact with the base, since this should produce a better final product with minimum reliance on the brazing step to ensure full contact.

Figure 10:
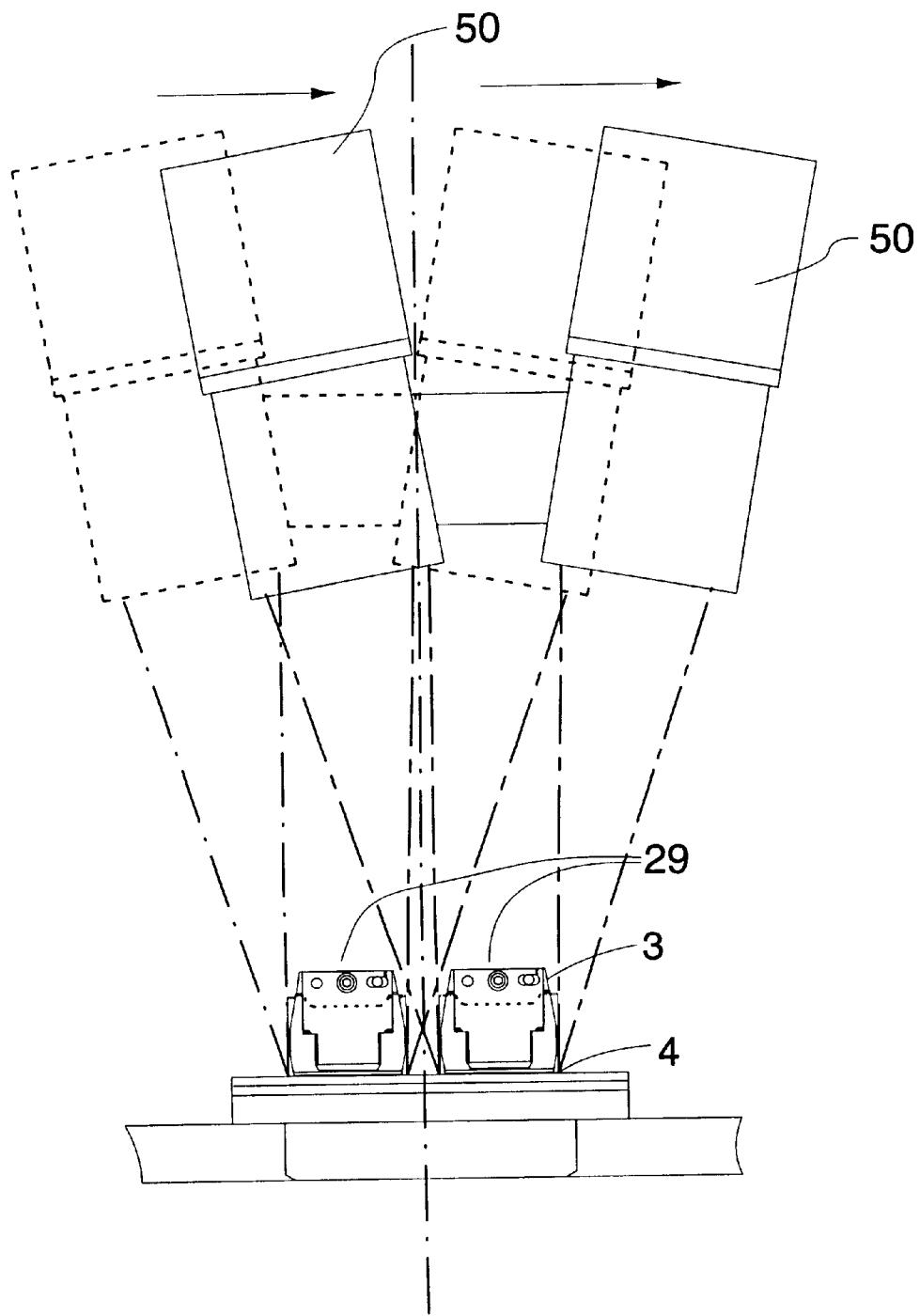
FIG. 10 is a radially inward view of the welding station.
Figure 11:
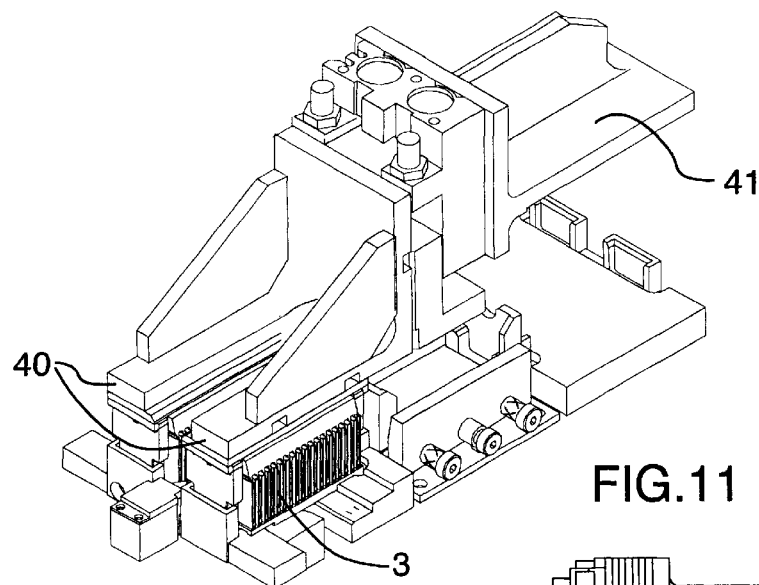
FIG. 11 is a perspective view of welding station, showing in particular the resilient plates for pressing against the finger tools.
Figure 12:
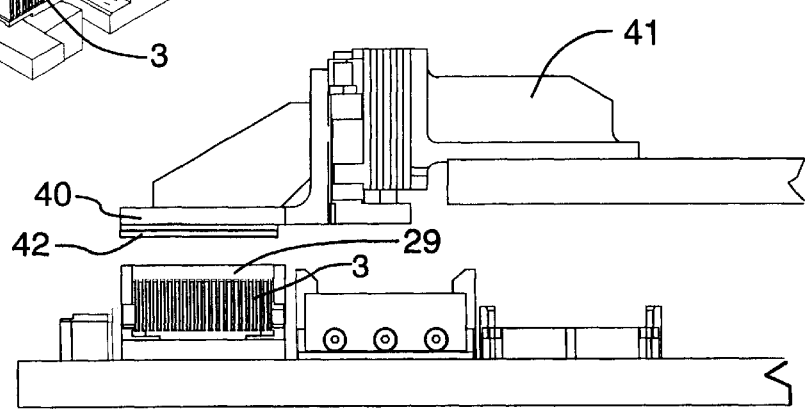
FIG. 12 is a circumferential elevation view corresponding to FIG. 11.

At the welding station 23, as seen in FIG. 10, there are preferably at least two laser heads 50 aiming down at the desired laser weld locations 4. The laser heads can be supplied by a single laser, using a conventional beam splitter, or separate lasers could be used. In the preferred embodiment, since laser welds are required on opposite sides of the folded-fin assemblies, the two laser heads are offset circumferentially from each other, and angled inwardly towards each other at about a 10 degree angle, as can be seen best from FIG. 10. This angle can obviously be varied as desired, but is intended to allow direct access of the laser beam to the desired weld locations 4.

The specific laser welding system to be employed is not critical to the invention, and may be readily selected by those knowledgeable in the field of laser welding. However, in the preferred embodiment, a JK700 Series YAG laser is used, supplied by GSI Lumonics. These lasers produce focused, highly accurate, highly controllable laser pulses for welding.

Figure 9:
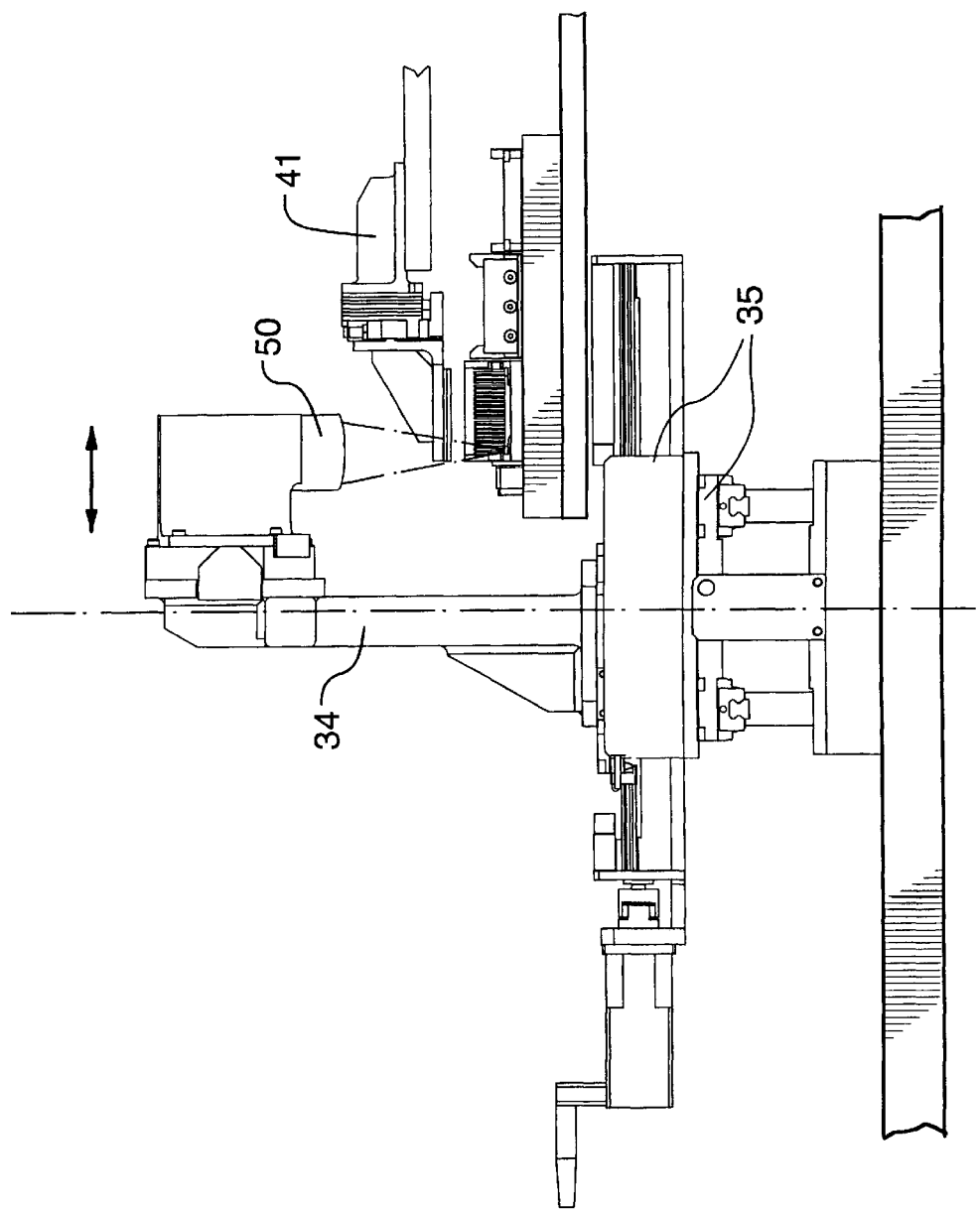
FIG. 9 is a side elevation view of the welding station.

To effect the laser welds, the beam from one laser head is first stepped along one side of the folded-fin assembly, from desired weld location to desired weld location, and is then fired at each location to effect the weld. The laser heads are mounted on a frame 34 which in turn is carried on an x-y table 35, as seen in FIG. 9. A servo advances the frame carrying the laser heads in a radial direction relative to the dial, to step from weld location to weld location.

When the laser welds are completed down one side of the folded-fin assembly, then unless separate lasers are used, the beam is transferred to the other laser head, which is suitably spaced and aimed to work in the opposite radial direction along the other side of the folded-fin assembly.

In the illustrated embodiment, where there are two folded-fin assemblies 3 to be laser welded, the laser heads are then shifted as shown in FIG. 10 to align them appropriately for laser welding of the second folded-fin assembly. The preceding operation is then repeated, so that one laser head effects the welds along one side, and then the other laser head effects the welds back along the other side.

In total, for the illustrated embodiment of FIGS. 1A to 1D, there are some 72 welds which are effected in a total time of just under 10 seconds.

The heat sink assembly is then unloaded from the apparatus, and is taken for brazing, soldering or other suitable bonding to the base. For example, the heat sink assembly may receive a spray application of flux which is then oven-dried, and may then be passed to a brazing furnace for heating to a temperature range of 1100 to 1120 degrees Fahrenheit to carry out the brazing. This is not part of the invention, which relates only to the steps leading up to the brazing, soldering or otherwise bonding.

It will be appreciated that the preceding description relates to specific embodiments of the invention, and that departures from the preceding will be readily apparent to those knowledgeable in the field of the invention, without necessarily departing from the spirit of the invention. Thus the claims which follow are intended to define the invention in its general terms, without being limited to the specific embodiments described above.

What is claimed as the invention is:

1. A method of manufacturing a folded-fin heat sink assembly, said assembly comprising a folded-fin assembly having spaced-apart fins separated by integral alternating upper and lower web portions, the lower web portions being bonded to a base, said method comprising the steps of:

positioning said folded-fin assembly an said base; and laser welding selected portions of selected lower web portions to said base to generally maintain said positioning, prior to fully bonding said lower web portions to said base; and fully bonding said lower web portion to said base.

2. A method as recited in claim 1, further comprising the step of pressing said folded-fin assembly against said base prior to said laser welding.

3. A method as recited in claim 1, further comprising the step of inserting finger elements into said folded fin assembly between adjacent fins, prior to said laser welding, to maintain desired spacing between adjacent fins.

4. A method as recited in claim 2, further comprising me step of inserting finger elements into said folded fin assembly between adjacent fins, prior to said laser welding, to maintain desired spacing between adjacent fins.

5. A method as recited in claim 1, wherein said step of positioning said folded-fin assembly on said base is carried out at one location, and said step of laser welding is carried out at another location.

6. A method as recited in claim 5, wherein said locations are at separate stations around a rotatable dial adapted to carry said base and folded-fin assemblies in suitable fixtures.

7. A method as recited in claim 5, further comprising the steps of:

loading a base into one of said fixtures at one station;

positioning a folded-fin assembly onto said base;

moving said base and folded-fin assembly to a separate station;

carrying out said laser welding at said separate station; and moving the welded base and folded-fin assembly from said welding station for unloading.

8. A method as recited in claim 7, wherein said stations are at separate locations around a rotatable dial adapted to carry said base and folded-fin assemblies in suitable fixtures.

9. A method of manufacturing a folded-fin heat sink assembly, said assembly comprising a folded-fin assembly having spaced-apart fins separated by integral alternating outer and inner web portions, the inner web portions being bonded to a cylindrical core, said method comprising the steps of:

positioning said folded-fin assembly around said core; and laser welding selected portions of selected inner web portions to said core to generally maintain said positioning, prior to fully bonding said inner web portions to said core, and fully bonding said inner web portions to said core.

10. A method as recited in claim 9, further comprising the step of pressing said folded-fin assembly against said core prior to said laser welding.

11. A method as recited in claim 9, further comprising the step of inserting finger elements into said folded fin assembly between adjacent fins, prior to said laser welding, to maintain desired spacing between adjacent fins.

12. A method as recited in claim 10, further comprising the step of inserting finger elements into said folded fin assembly between adjacent fins, prior to said laser welding, to maintain desired spacing between adjacent fins.

13. A method as recited in claim 9, wherein said step of positioning said folded-fin assembly around said core is carried out at one location, and said step of laser welding is carried out at another location.

14. A method as recited in claim 13, wherein said locations are at separate stations around a rotatable dial adapted to carry said core and folded-fin assemblies in suitable fixtures.

15. A method as recited in claim 13, further comprising the steps of:
loading a core into one of said fixtures at one station;
positioning a folded-fin assembly around said core;
moving said core and folded-fin assembly to a separate station;
carrying out said laser welding at said separate station; and
moving the welded core and folded-fin assembly from said welding station for unloading.

16. A method as recited in claim 15, wherein said stations are at separate locations around a rotatable dial adapted to carry said core and folded-fin assemblies in suitable fixtures.

* * * * *